United States Patent [19]

Leicht

[11] Patent Number: 5,381,945

[45] Date of Patent: Jan. 17, 1995

[54] PROCESS FOR SOLDERING MATERIALS LIKE PRINTED CIRCUIT BOARDS OR SETS OF COMPONENTS IN ELECTRONICS OR METALS IN ENGINEERING WORK

[76] Inventor: Helmut W. Leicht, Messerschmittring 61, 86343 Königsbrunn, Germany

[21] Appl. No.: 94,081

[22] PCT Filed: Jan. 31, 1992

[86] PCT No.: PCT/EP92/00213

§ 371 Date: Jul. 27, 1993

§ 102(e) Date: Jul. 27, 1993

[87] PCT Pub. No.: WO92/14347

PCT Pub. Date: Aug. 20, 1992

[30] Foreign Application Priority Data

Feb. 1, 1991 [DE] Germany ............... 4103098

[51] Int. Cl.$^6$ ................................ B23K 1/00
[52] U.S. Cl. ..................... 228/180.21; 228/234.1
[58] Field of Search ............ 228/234.1, 234.2, 180.21

[56] References Cited

U.S. PATENT DOCUMENTS

| | | | |
|---|---|---|---|
| 2,986,811 | 6/1961 | Rudd | 228/234.1 X |
| 3,298,588 | 1/1967 | Shomphe | 228/20 |
| 3,435,801 | 4/1969 | Carini et al. | 118/63 |
| 3,724,418 | 4/1973 | McLain | 118/69 |
| 3,825,994 | 7/1974 | Coleman | 228/234.1 |
| 4,022,371 | 5/1977 | Skarvinko et al. | 228/223 |
| 4,240,453 | 12/1980 | Vial et al. | 134/107 |
| 4,315,042 | 2/1982 | Spigarelli | 427/96 |
| 4,332,342 | 6/1982 | van Der Put | 228/234.1 X |
| 4,453,916 | 6/1984 | Osipov et al. | 432/197 |
| 4,489,508 | 12/1984 | Carlson et al. | 34/78 |
| 4,589,926 | 5/1986 | Holmstrand | 134/6 |
| 4,809,443 | 3/1989 | Mishina et al. | 34/73 |
| 4,830,263 | 5/1989 | Dexheimer | 228/234.1 X |
| 4,874,124 | 10/1989 | Johns et al. | 228/234.2 X |
| 4,927,068 | 5/1990 | Naka et al. | 228/234.1 X |

FOREIGN PATENT DOCUMENTS

| | | | |
|---|---|---|---|
| 217588 | 4/1987 | European Pat. Off. | H05K 3/34 |
| 2442180 | 3/1975 | Germany | B23K 1/02 |
| 2502900 | 7/1976 | Germany | H05K 3/34 |
| 3028325 | 2/1981 | Germany | H05K 3/26 |
| 3006045 | 8/1981 | Germany | B05D 1/02 |
| 3814870 | 11/1989 | Germany | B23K 1/02 |
| 3840098 | 12/1989 | Germany | B23K 1/00 |
| 232058 | 10/1986 | Japan . | |
| 2159084 | 11/1985 | United Kingdom | B23K 1/00 |

OTHER PUBLICATIONS

Weichlöten in der Elektronik by R. J. Klein Wassink, pp. 189, 258–260, 351–352, 363. (1986).

M. Bucher, Reflow-Lotverfahren in Vergleich, Elektronik, 7, pp. 108–110, 112, 113, Mar. 31, 1988.

*Primary Examiner*—Kenneth J. Ramsey
*Attorney, Agent, or Firm*—Parmelee, Bollinger & Bramblett

[57] ABSTRACT

The description relates to a process for soldering printed circuit boards or sets of components in electronics or metals in engineering work. The heat required for the soldering process is at least partly transmitted to the soldering points by wetting with a heated liquid.

9 Claims, No Drawings

PROCESS FOR SOLDERING MATERIALS LIKE PRINTED CIRCUIT BOARDS OR SETS OF COMPONENTS IN ELECTRONICS OR METALS IN ENGINEERING WORK

The invention relates to a process for the soldering of parts, such as printed circuit boards or sets of components in the field of electronics, or metals in the field of mechanical manufacture. Processes of that kind result in a solid connection of the soldered parts by means of a solder, wherein said solder has to be melted beforehand.

It is known from DE-A-39 15 040 that the parts to be soldered should be preheated by spraying them with a liquid before the actual vapor-phase soldering is carried out. It is known from DE-A-10 81 088 that after the soldering process, the soldered joint should be submitted to a thermal aftertreatment by means of a vapor jet. The actual soldering process, however, is usually a flow solder method or a common reflow solder method like infrared soldering, hot-air soldering or vapor-phase soldering.

Known soldering processes are the flow solder method wherein already liquid solder is applied to the soldering area, and several reflow soldering methods wherein the solder is applied on the parts beforehand and is melted during the process in order to produce the soldered joint. Examples of such reflow soldering methods are infrared soldering, wherein the melting of the solder is carried out by means of infrared radiation; hot bar soldering, wherein the heat transfer is carried out through contact; hot-air soldering, wherein the heat transfer is carried out by convection; and vapor-phase soldering, wherein the heat transfer is carried out by condensation of the vapor in the area to be soldered.

When using these known soldering processes, a thermal overloading of the parts to be soldered is hard to prevent. An optimized process should be aimed at keeping the temperatures of the parts to be soldered as low as possible, i.e. just above the melting point of the solder. During the known soldering processes, there is generally a temperature difference of at least 30° C. between the temperature of the heat transfer medium and the melting point of the solder. This temperature difference is necessary to ensure a safe soldering process during the time interval needed for manufacture while keeping the heat transfer in mind. Also, the mentioned processes do not allow to exactly control the temperature or to carry out minor temperature adjustments during the heat transfer.

In another known process for the tinning of printed circuit boards, excess solder is removed by means of a hot liquid, e.g. oil, after the tinning process. Such a process is referred to as "Hot Oil Leveling". It involves the spraying of pressurized hot oil onto the printed circuit board. The oil causes the excess solder to melt, levels the soldered connection and removes the excess solder. Afterwards, the oil has to be cleaned off the printed circuit board. This method cannot be used for the soldering process itself.

The problem underlying this invention is to provide a process for the soldering of parts such as printed circuit boards or modules in the field of electronics, or metals in the field of mechanical manufacture, resulting in a small temperature load on the parts, a finely and variably adjustable heat transfer as well as a clean and cost-effective process.

This problem is solved by the features of the claims.

The solution of the invention is based on the concept that the temperature at the soldering area can, by means of a liquid at the desired temperature, be controlled in such a way that it is at or slightly above the melting point of the solder with the liquid also entering gaps and that by means of the favorable heat transfer properties of the liquid the heat is passed on quickly to the soldering area.

The advantages of the invention are the following: The temperature of the liquid can be precisely controlled—and, if desired, additional influence can be exerted by controlling the amount of liquid—, therefore any desired soldering profile can be predetermined; a very slight increase in temperature can be effected which ensures maximum protection of electronic components; due to an even spreading of the liquid on the surface of the parts, an extremely even heat transfer is guaranteed; and only a slight difference in temperature (<10° C.) between the higher temperature of the liquid and the melting point of the solder is necessary.

In a process according to the invention, the surface of the parts is in contact with the heated liquid. The parts to be soldered can consist of various electronic components or mechanically manufactured parts which are supposed to be joined by solder. Said solder, either in its solid state or as solder paste, is close to the parts to be soldered, or it is introduced in liquid form, e.g. by means of a solder flow.

In the latter case, the parts to be soldered are heated up by the heated liquid, so that there is only a small heat transfer from the solder flow. Therefore, the process according to the invention allows a decrease in the temperature of the solder flow from 240° to 260° C. down to 190° C., thus reducing the thermal load on the modules.

In the case of solid or paste solder, the heat necessary for melting the solder is transferred by the liquid. This process only requires a very short amount of time, due to the efficient heat transfer and the favorable creeping properties of liquids, and it solely requires a slightly higher temperature than the melting point of the solder.

After the soldering process, the excess liquid evaporates due to the excess heat of the soldered parts. However, it is also advantageous to submit the soldered parts to a drying process, e.g. by means of a hot-air blower.

The process according to the invention makes use of chemically inert liquids, which, in particular, do not have oxidizing or reducing properties, and are chemically stable at the relevant temperatures, i.e. do not decompose at these temperatures. Due to the wetting of the soldering area, a protective film is formed which prevents oxidation during the soldering process and thus allows the use of mild fluxing agents and fluxing agents low in solid matter possible.

The variable temperature control applied in the process according to the invention allows the processing of solders with low and high melting points. The temperature gradients resulting from the heating process can be controlled extremely well. By varying the temperature of the liquid, temperature gradients of e.g. between 0,3° C. sec$^{-1}$ and 15° C. sec$^{-1}$ can be adjusted. Small temperature gradients are especially advantageous in the electronics industry since a rapid heating leads to the damage of sensitive components. By controlling the temperature of the liquid during the heating-up process of the solder, any desired temperature profile can be adjusted and thus optimal conditions for any perceivable circumstances can be created.

To a great extent, the process is freely controllable and can be applied both for continuous operations and discontinuous operations. The amount of liquid necessary varies according to the type of parts to be soldered, e.g. electronic modules or metallic mechanic components. The amount of the liquid introduced can be controlled in such a way that mainly the necessary amount of heat resulting from the heat capacity of the soldering area will be transferred to the parts and thus a heating-up of the components will be restricted to a high degree. Moreover, the parts can be preheated externally (outside of the soldering unit) and the process can then be carried out in one or several work stations.

In the following, a process according to the invention will be illustrated by means of a few examples.

EXAMPLE 1

The Soldering of Metal Parts in Combination with a Liquid at a Fixed Temperature Metal parts are indifferent to rapid warming and can therefore be warmed up with extensive temperature gradients.

The parts to be soldered
1. are not preheated externally,
2. are introduced into the soldering unit,
3. reach the soldering chamber at a temperature of 23° C.,
4. are wetted for 20 seconds with a hot liquid (temperature of the liquid 220° C.), which results in a rapid increase in temperature,
5. warm up until they reach the soldering temperature, the soldering process is carried out (starting at 183° C.),
6. leave the soldering chamber at a temperature of about 210° C.,
7. enter the drying chamber of the soldering unit (circulating air), and
8. leave the soldering unit in a dry state.

EXAMPLE 2

The Soldering of Metal Parts in Combination with a Liquid at a Fixed Temperature and a Preheating Process within the Soldering Unit The parts to be soldered
1. are not preheated externally,
2. are introduced into the soldering unit, are wetted in the warming chamber with a liquid at 130° C. for 10 seconds, this results in a rapid increase in temperature during which the parts heat up to a temperature of about 125° C.,
3. are introduced into the soldering chamber at a temperature of 121° C.,
4. are wetted with a liquid for 10 seconds (temperature of the liquid 210° C.), this results in a rapid increase in temperature,
5. heat up to a temperature of about 208° C., the soldering process is carried out (starting at 183° C.),
6. leave the soldering chamber at a temperature of about 202° C.,
7. enter the drying chamber of the soldering unit (circulating air), and
8. leave the soldering unit in a dry state.

EXAMPLE 3

The Soldering of an Electronic Module in Combination with a Variable Temperature of the Liquid and an External Preheating Process Due to the components to be processed, electronic modules are sensitive towards large temperature gradients during the heating process to reach the soldering temperature, therefore the heating process is carried out by means of small temperature gradients.

The module
1. is preheated externally to about 120° C.,
2. is introduced into the soldering unit,
3. reaches the soldering chamber at a temperature of 103° C.,
4. is wetted with a liquid for 20 seconds, during which time interval the temperature of the liquid rises from 110° C. to 200° C.,
5. heats up, the soldering process is carried out (starting at 183° C.),
6. leaves the soldering chamber at a temperature of about 195° C.,
7. enters the drying chamber of the soldering unit (circulating air), and
8. leaves the soldering unit in a dry state.

EXAMPLE 4

The Soldering of an Electronic Module in Combination with a Variable Temperature of the Liquid without an External Preheating Process The module
1. is not preheated externally
2. is introduced into the soldering chamber of soldering unit,
3. is wetted with a liquid for 10 seconds, at the beginning of the wetting process the temperature of the liquid remains 100° C. for 10 seconds, and during the following 20 seconds is continually raised to 195° C.,
4. heats up to close to 195° C., the soldering process is carried out (starting at 183° C.),
5. is then wetted with a liquid for 10 seconds, the temperature of the liquid being 160° C., which leads to a rapid decrease in the temperature of the module down to below the melting point of the solder,
6. leaves the soldering chamber at a temperature of about 165° C.,
7. enters the drying chamber of the soldering unit (circulating air), and
8. leaves the soldering unit in a dry state.

The wetting with a liquid can preferably be carried out as a spraying process (spray soldering). A spraying process of that kind makes use of equipment comprising one or more nozzles which are lined up evenly either above or below the parts to be soldered. Alternatively, an even spraying of the entire surface can be carried out by actuating all the nozzles or a selective spraying can be achieved by solely actuating individual nozzles or groups of nozzles during the spraying process.

Beyond its application as a soldering process, this process can also be applied in every area where the process temperature has to be varied and/or precisely controlled to a great extent, e.g. for the Burn-In of modules or in drying processes etc.

I claim:
1. In a process for flow soldering of electronic components or metal mechanical parts utilizing a solder flow in liquid form, wherein the improvement compris- ing transferring a part of the heat necessary for the soldering process to a soldering area by means of an additional heated sprayed liquid which heats up the parts, and wherein at least one of the two following controls is employed: (1) the temperature of the heated sprayed liquid is controlled according to a predetermined temperature profile and, (2) the amount of the sprayed liquid is controlled time dependently.

2. Process according to claim 1, characterized in that the temperature of said heated liquid is controlled according to a predetermined temperature profile.

3. Process according to claim 1, characterized in that the amount of the sprayed liquid is controlled.

4. Process according to claim 3, characterized in that the amount of the sprayed liquid is controlled according to the heat capacity of the soldering area.

5. Process according to claim 1, characterized in that the heated liquid flows over the parts.

6. Process according to claim 1, characterized in that the heated liquid selectively moistens the soldering area.

7. Process according to claim 1, characterized in that the heated liquid is chemically inert.

8. Process according to claim 1, characterized in that the soldering areas are preheated at a lower temperature by means of the heated liquid prior to the soldering process.

9. Process according to claim 1 in which flow solder having a temperature of about 190° C. is employed.

* * * * *